United States Patent
Sato et al.

(10) Patent No.: US 7,593,705 B2
(45) Date of Patent: Sep. 22, 2009

(54) RADIO RECEIVER AND GAIN CONTROL METHOD

(75) Inventors: Tadahiro Sato, Kawasaki (JP); Akifumi Adachi, Kawasaki (JP)

(73) Assignee: Fujitsu limited, Kawasaki (JP)

( * ) Notice: Subject to any disclaimer, the term of this patent is extended or adjusted under 35 U.S.C. 154(b) by 659 days.

(21) Appl. No.: 11/287,787

(22) Filed: Nov. 28, 2005

(65) Prior Publication Data

US 2006/0079193 A1 Apr. 13, 2006

Related U.S. Application Data

(63) Continuation of application No. PCT/JP03/09484, filed on Jul. 25, 2003.

(51) Int. Cl.
*H04B 1/06* (2006.01)
*H04Q 7/20* (2006.01)

(52) U.S. Cl. .............. 455/234.1; 370/347; 375/345

(58) Field of Classification Search ............ 455/232.1, 455/234.1–234.2, 237.1, 240.1, 245.1, 247.1; 370/337, 347; 375/345
See application file for complete search history.

(56) References Cited

U.S. PATENT DOCUMENTS 6,240,100 B1 * 5/2001 Riordan et al. ............ 370/442

2002/0090042 A1 7/2002 Heinonen et al.

FOREIGN PATENT DOCUMENTS

| EP | 1 172 930 | 1/2002 |
|----|-----------|--------|
| JP | 4-014335 | 1/1992 |
| JP | 4-299608 | 10/1992 |
| JP | 5-102939 | 4/1993 |
| JP | 05-102939 | * 4/1993 |
| JP | 2001-060981 | 3/2001 |

OTHER PUBLICATIONS

Supplementary European Search Report dated Jul. 24, 2006.
Notice of Rejection dated Mar. 4, 2008, from the corresponding Japanese Application. (Partial Translation Attached).
International Search Report dated Nov. 4, 2003.
Keiji Tachikawa. W-CDMA Mobile Communication System. Published by Maruzen Company, Limited, Jun. 25, 2001.

* cited by examiner

*Primary Examiner*—Lee Nguyen
(74) *Attorney, Agent, or Firm*—Katten Muchin Rosenman LLP

(57) ABSTRACT

A radio receiver includes a branching unit, a first gain-control system, a second-gain control system, and a signal processing unit. The branching unit branches a radio signal received by the radio receiver into two signals. The first-gain control system performs a gain control of a pilot signal in one of branched signals, and the second gain control system performs a gain control of a data signal in another of the branched signals. The signal processing unit synchronizes frames in the received radio signal. The signal processing unit outputs a gain signal to each of the first gain-control system and the second gain-control system. The first gain-control system and the second gain-control system perform the gain controls based on the gain signal.

18 Claims, 8 Drawing Sheets

RADIO RECEIVER AND GAIN CONTROL METHOD

CROSS-REFERENCE TO RELATED APPLICATION

This application is a continuation of International Application PCT/JP03/09484, filed on Jul. 25, 2003, pending at the time of filing of this continuation application, the contents of which are herein wholly incorporated by reference

BACKGROUND OF THE INVENTION

1. Field of the Invention

The present invention relates to a radio receiver that receives a radio signal and performs an automatic gain control on the radio signal.

2. Description of the Related Art

A general radio receiver includes an automatic gain control (AGC) function for adjusting a gain corresponding to an electric power (or a voltage) of an input signal. The AGC function increases a gain of an amplifier when an input power is smaller than a predetermined reference power (or decreases an attenuation by a variable attenuator), or decreases the gain of the amplifier when the input power is larger than the reference power, or increases the attenuation by the variable attenuator. Accordingly, the level of the received signal is kept constant to be input to an analog-digital converter (ADC), thereby realizing a wide dynamic range.

The reference power in such an AGC circuit is fixed at a constant value. Furthermore, it is necessary to set the AGC circuit to a slow time constant to some extent, so that an amplitude component of the signal does not change more than necessary. In a calculation of the reception power, the reception power is averaged over a specific long-time interval (for example, over several tens of frame lengths), and the average reception power is used for the AGC. Such an AGC technique is disclosed in, for example, "W-CDMA Mobile Communications System" by Keiji TACHIKAWA, P. 29, FIGS. 2-4, Maruzen Co., Ltd. Publishing Division.

However, the conventional AGC circuit assumes that a power difference does not occur between time slots within a monitored cycle (for example, within one frame). Therefore, when a power difference occurs between time slots within the monitored cycle, appropriate AGC control cannot be performed. Hence, the input level with respect to analog devices such as an amplifier and a mixer, and the ADC in the subsequent stage is not appropriate, thereby causing a problem in that an S/N ratio of the input signal deteriorates, or on the contrary, signal distortion or clipping occurs.

Conventionally, therefore, it has been necessary to use a high-performance analog device that can sufficiently ensure back-off so that the received signal is not distorted, and a high-performance ADC having high effective bit accuracy so as to reduce S/N deterioration due to a quantization error, to constitute a radio receiver. Accordingly, the unit price of the necessary device increases, thereby increasing the whole price of the radio receiver.

SUMMARY OF THE INVENTION

It is an object of the present invention to at least solve the above problems in the conventional technology.

A radio receiver according to one aspect of the present invention includes a receiving unit configured to receive a radio signal in which a first signal and a second signal are time-multiplexed in a frame; and a gain-control unit configured to perform a gain control on the radio signal with a different gain for each of the first signal and the second signal.

An gain control method according to another aspect of the present invention includes receiving a radio signal in which a first signal and a second signal are time-multiplexed in a frame; and performing a gain control on the radio signal with a different gain for each of the first signal and the second signal.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will be explained below with reference to the accompanying drawings. A reception level of a radio signal varies between time slots within one frame. A radio receiver and an automatic gain control method according to embodiments of the present invention performs the automatic gain control stably, even when a power difference occurs between the time slots in the frame, such as a frame in a radio signal obtained by an orthogonal frequency division multiplexing (OFDM).

Figure 1:
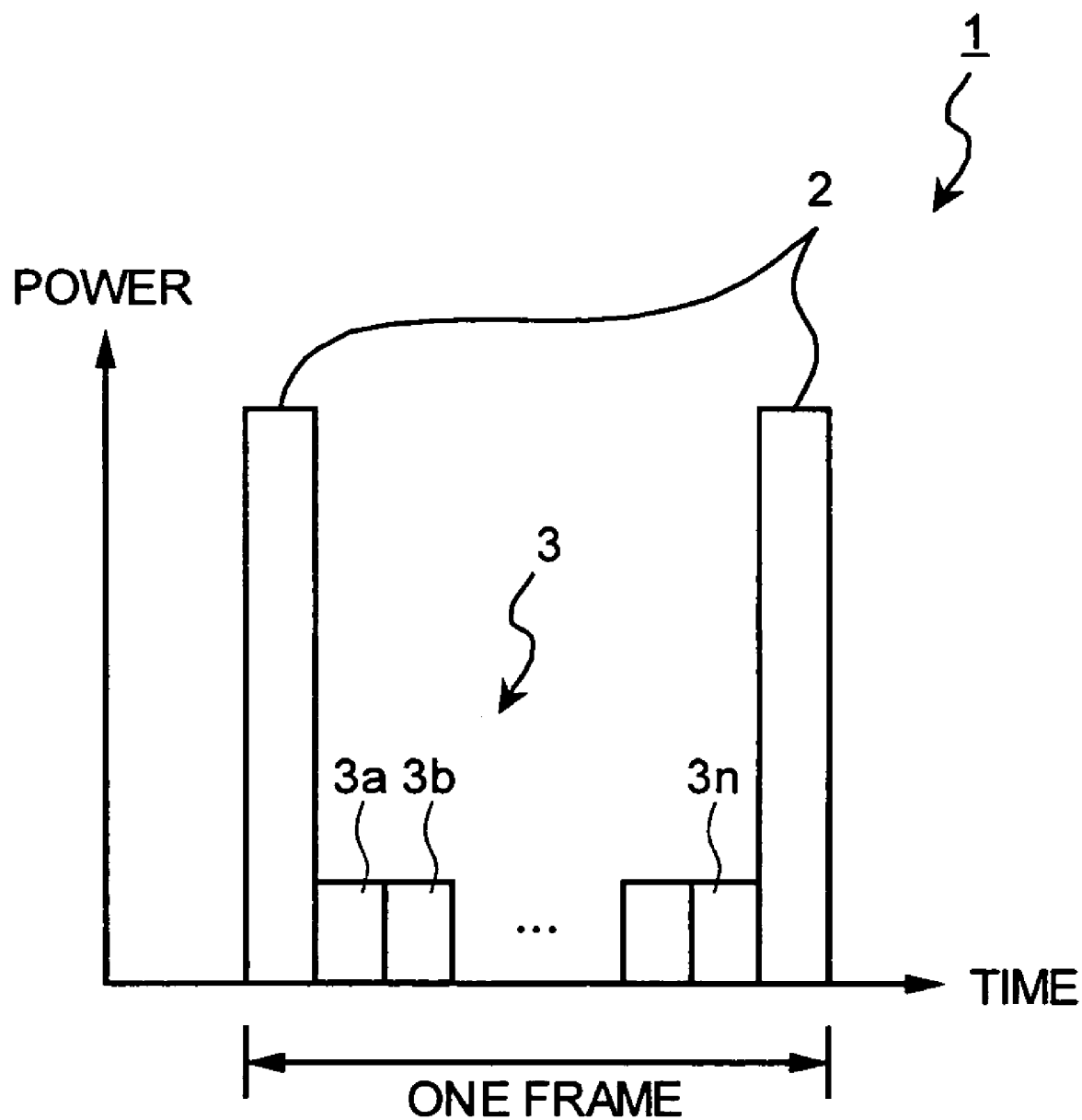
FIG. 1 depicts a frame format of a radio signal to be received by a radio receiver according to the present invention.

FIG. 1 depicts a frame format of a radio signal to be received by a radio receiver according to embodiments of the present invention. Time is plotted on the horizontal axis and power is plotted on the vertical axis. There are two common pilot signals 2 and a plurality of data signals 3 (3a to 3n) in one frame. These common pilot signals 2 and the data signals 3 are allocated to different time slots in a time-sharing manner. The common pilot signal 2 may be provided more than two in one frame. The portion corresponding to the data signals 3 is formed by adding data signals of one user or a plurality of users, and the data signals 3 in one frame have substantially the same power.

In the present embodiment, it is assumed that the radio signal has such a radio frame format that signals of a plurality of stations are multiplexed at the same time and on the same frequency, and the ratio between the power of the common pilot signal 2 and the individual data signal 3 varies dynamically, corresponding to the transmission rate or the surrounding environment. In the example shown in FIG. 1, the power of the data signal 3 is smaller than that of the common pilot signal 2 (the power ratio is large). The common pilot signals 2 are transmitted in a certain power, while the power of the data signals 3 varies largely according to the number of multiplexed codes. The number of multiplexed codes varies according to the number of users who perform multiplexing or the data transmission rate.

The radio receiver according to embodiments of the present invention discriminates between the common pilot signal 2 and the individual data signal 3, based on a significant difference in power between the common pilot signal 2 and the individual data signal 3, and operates the AGC function so that a wide dynamic range can be ensured in respective time slots.

Figure 2:
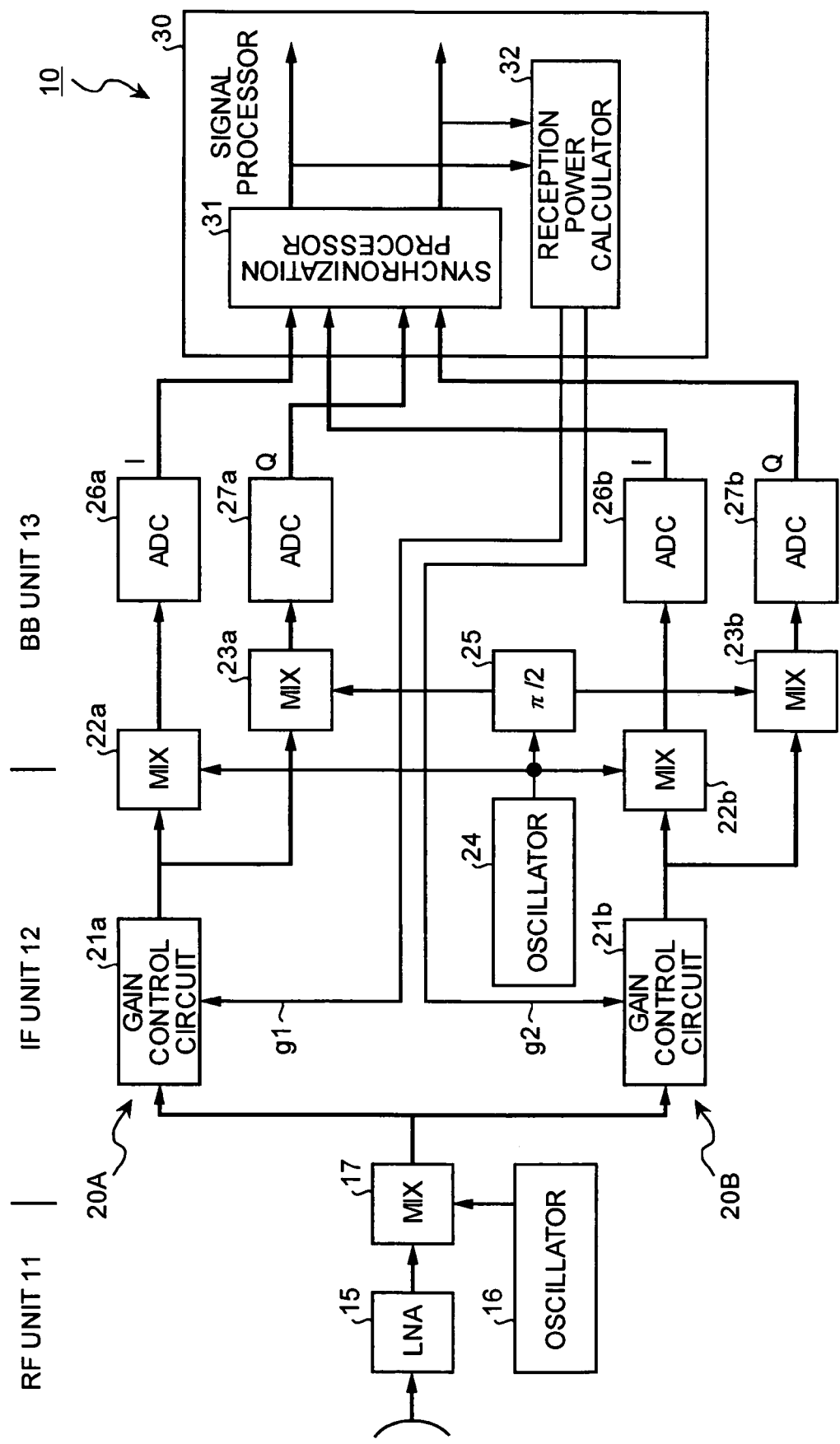
FIG. 2 is a block diagram of a radio receiver according to a first embodiment of the present invention.

FIG. 2 is a block diagram of a radio receiver according to a first embodiment of the present invention. As the radio receiver is, for example, a mobile station in a mobile communication system. A radio receiver 10 includes an RF unit 11 that handles high frequency band signals, an IF unit 12 that handles medium frequency band signals, and a BB unit 13 that handles base-band signals. In the RF unit 11, high frequency band input signals go through a low noise amplifier (LNA) 15, and are mixed with a signal from an oscillator 16 by a mixer (MIX) 17, thereby being converted to IF frequency band signals.

The signal input to the IF unit 12 is branched into two to be input to gain control circuits 21 (21*a* and 21*b*) of the respective systems. The signal is by simply branched into two while maintaining the frame configuration. One of the branched systems is a gain control system 20A for the common pilot signal 2 and the other is a gain control system 20B for the individual data signal 3. These gain control systems 20A and 20B are arranged in parallel, and performs the gain control concurrently.

Since the two gain control systems 20A and 20B have the same configuration, only one system 20A will be explained. Respective components arranged in the system 20A are denoted by "a" at the end. Respective components arranged in the other system 20B are denoted by "b" at the end, and the explanation thereof is omitted. The gain control circuit 21*a* includes an amplifier (Amp), an attenuator (ATT), and a device that controls the amplifier and the attenuator, so as to be able to change the power (gain) of the input IF frequency band signal. The gain control circuit 21 has an AGC function for gain-controlling input data based on a gain control signal output by a reception power calculator 32.

The IF signal output from the gain control circuit 21*a* is input to two routes by a divider and respectively input to mixers (MIX) 22*a* and 23*a*. The divider and the mixers are formed of a general quadrature detector (demodulator) (QDEM). One mixer 22*a* mixes the IF signal with a signal from an oscillator 24, to output a base-band signal (I). The other mixer 23*a* mixes the IF signal with a signal obtained by rotating the phase of the signal from the oscillator 24 by $\pi/2$ (90 degrees) by a phase changing unit 25 to output a baseband signal (Q). These base-band signals is input to the ADCs 26*a* and 27*a* via a filter (not shown) and the amplifier and converted to digital data by the ADCs 26*a* and 27*a*. The two systems, the gain control systems 20A and 20B, perform the AGC operation concurrently. Quadrature demodulation can be performed in the digital region, by arranging the ADCs 26*a* and 27*a* prior to quadrature demodulation.

The base-band signals I and Q with the gain being controlled for the common pilot signal 2 are input to the signal processor 30 from the one gain control system 20A. The base-band signals I and Q with the gain being controlled for the individual data signal 3 are input to the signal processor 30 from the other gain control system 20B. With regard to the common pilot signal 2 and the individual data signal 3, the I signal is input from the same port, respectively, and the Q signal is input from the same port different from that for the I signal, respectively.

The signal processor 30 performs various types of signal processing by using the input digital data. Specifically, the signal processor 30 performs signal processing such as deinterleaving, digital demodulation, and error correction decoding. When adopting the OFDM-CDMA method, the signal processor 30 can perform de-spreading processing. The output from the signal processor 30 can be such that the received data is displayed on a display unit or voice is output from a speaker. The signal processor 30 includes a synchronization processor 31 and the reception power calculator 32. The synchronization processor 31 establishes synchronization between I and Q signals in a unit of frame to identify the common pilot signal 2 and the individual data signal 3. The reception power calculator 32 discriminates between the common pilot signal 2 and the individual data signal 3, and calculates the respective reception power. The reception power can be calculated by various methods, such as by square root of sum of square of the I and Q signals. Furthermore, the reception power can be also calculated as an average reception power for a predetermined period (for example, for a plurality of frames).

The reception power calculator 32 outputs a gain control signal that changes the gain with respect to the gain control circuit 21 (21*a* and 21*b*) based on the calculated respective reception power. At this time, with regard to the ADC 26 (26*a* and 26*b*), the gain is changed so that the signal level of the common pilot signal 2 input to the ADC 26 (26*a* and 26*b*) or the output signal level becomes steady. With regard to the ADC 27 (27*a* and 27*b*), the gain is changed so that the signal level of a signal (a signal other than the common pilot signal 2, for example, the individual data signal 3) input to the ADC 27 (27*a* and 27*b*) or the output signal level becomes steady. A gain control signal g1 controls the gain of the gain control circuit 21*a* provided in the gain control system 20A for common pilot signals 2, and a gain control signal g2 controls the gain of the gain control circuit 21*b* provided in the gain control system 20B for the individual data signal 3.

According to the above configuration, the reception power calculator 32 needs only to discriminate a time slot whose power largely changes from others in the respective branched two gain control systems 20A and 20B for the common pilot signal 2 and the individual data signal 3, and output the gain control signals g1 and g2 in the time-sharing manner, designating the largely changing time slot as a unit. Therefore, the reception power calculator 32 does not need to perform the AGC at a high speed in one frame. In other words, the reception power calculator 32 does not need to output the gain control signals g1 and g2 in a unit of time slot, and the same value as in the conventional AGC circuit can be used as the time constant for the AGC (as the control cycle of the gain control), and any particular high-speed processing is not required.

Figure 3:
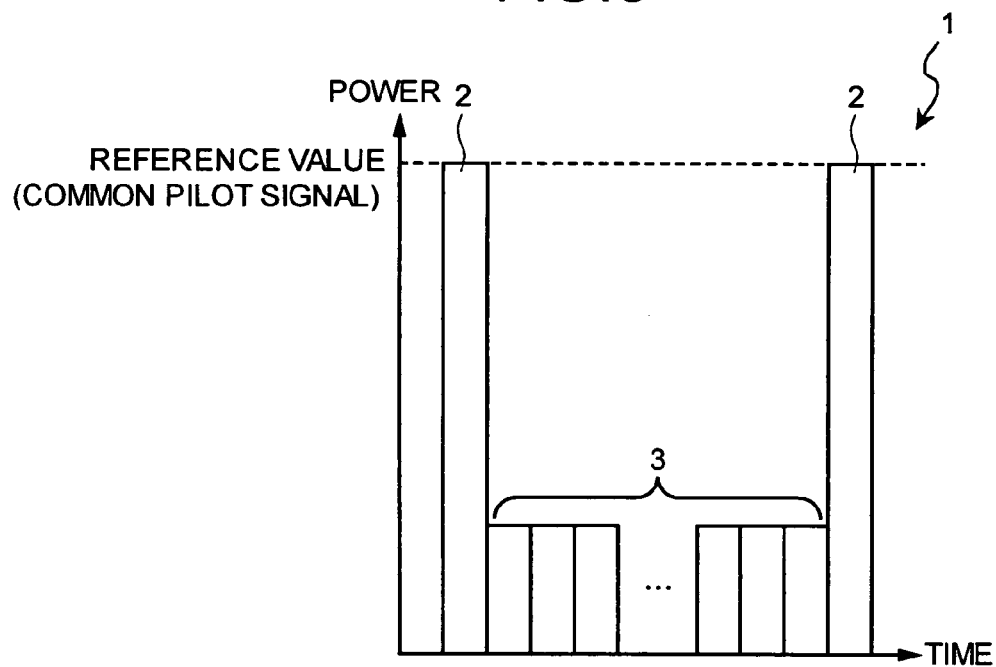
FIG. 3 depicts a state in which a gain control of a common pilot signal is performed when a power ratio is large.

FIG. 3 depicts a state in which the gain control of the common pilot signal is performed when the power ratio is large. When the power ratio is large, the gain control circuit 21a provided in the gain control system 20A for common pilot signals 2 changes the gain so that the power of the common pilot signal 2 in an input frame 1 becomes a reference value. When the power of the common pilot signal 2 is smaller than the reference value, the gain is increased so that the power of the common pilot signal 2 becomes the reference value. When the power of the common pilot signal 2 is larger than the reference value, the gain is decreased so that the power of the common pilot signal 2 becomes the reference value. When the gain is changed, the gain of the data signal 3 will be similarly changed according to the power ratio.

The variability of the gain is controlled by the gain control signal g1. The reception power calculator 32 calculates a transition of the power value of the common pilot signal 2 in a plurality of frames in the past by averaging or the like. The gain control circuit 21a changes the gain according to the input of the gain control signal g1 based on the calculation result.

For the reference value, a value preset based on an appropriate input level, at which the ADCs 26a and 27a provided in the gain control system 20A for common pilot signals 2 do not saturate, is used. The reference value can be set based on an input level, at which not only saturation of the ADC but also S/N deterioration or signal distortion of the mixer and the amplifier do not occur. Thus, even if there is no ADC in the subsequent stage, the requirement of an element whose input level is to be restricted can be satisfied.

Figure 4:
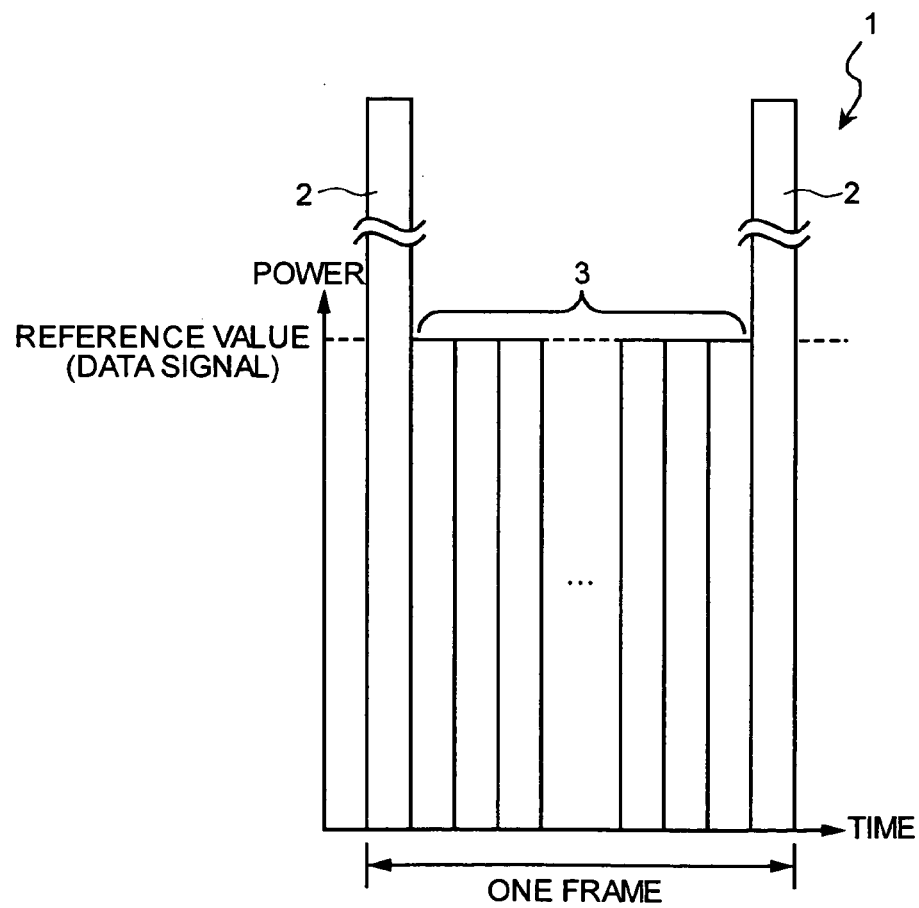
FIG. 4 depicts a state in which a gain control of a data signal is performed when a power ratio is large.

On the other hand, the gain control circuit 21b provided in the gain control system 20B for data signals 3 changes the gain so that the power of the data signal becomes the reference value based on the measurement result of the power of the data signal 3 in the same frame 1. FIG. 4 depicts a state in which the gain control of the data signal is performed when the power ratio is large, in which the reception level of the common pilot signal 2 is not taken into consideration. The variability of the gain with respect to the data signal is controlled by the gain control signal g2. FIG. 4 depicts a condition in which when the gain of the data signal 3 is changed, the power of the common pilot signal 2 is also changed according to the power ratio, and hence, the power of the common pilot signal 2 largely exceeds the reference value with respect to the data signal 3.

The gain control system 20A controls the gain with respect to the common pilot signal 2, and the gain control system 20B controls the gain with respect to the individual data signal 3, basically regardless of the power ratio.

Figure 5:
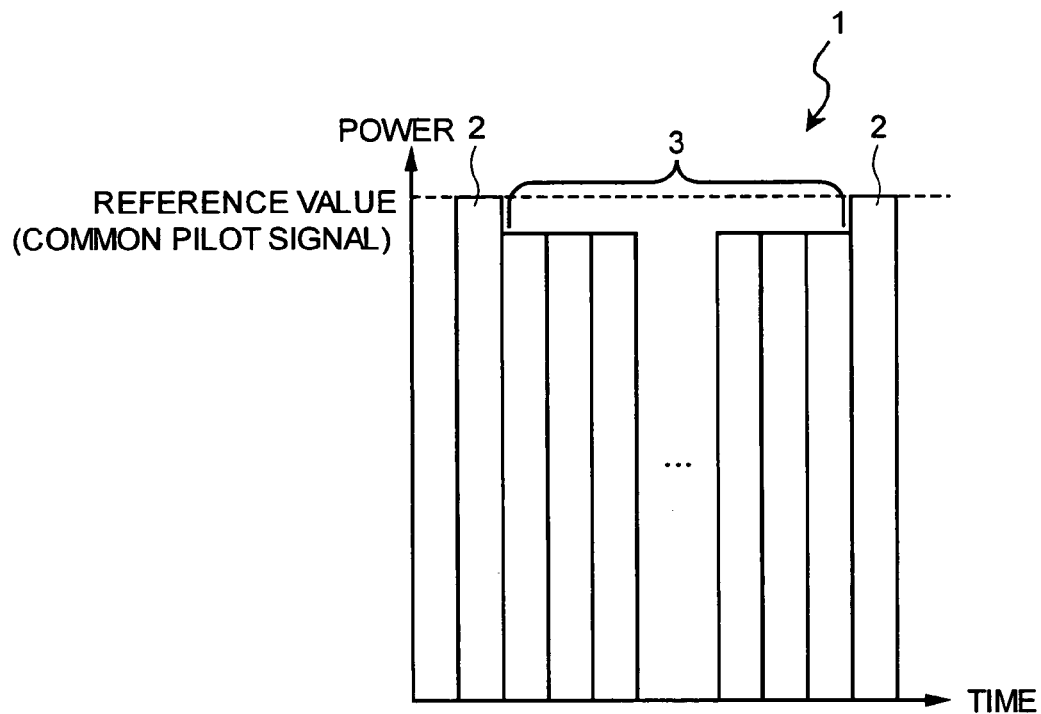
FIG. 5 depicts a state in which a gain control of the common pilot signal is performed when a power ratio is small.
Figure 6:
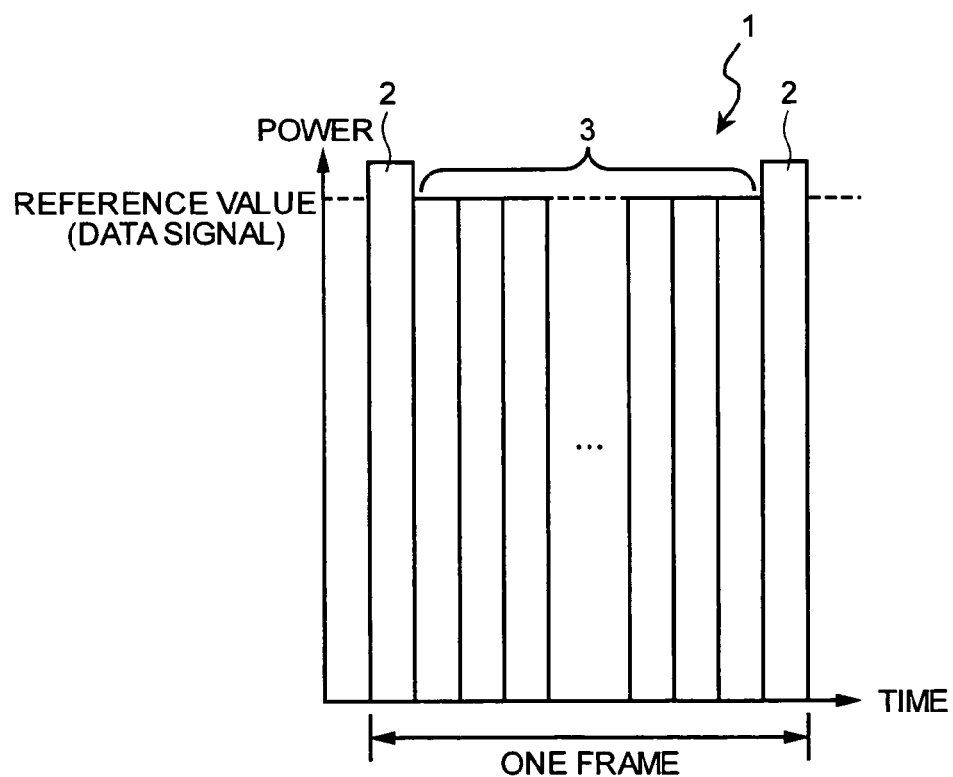
FIG. 6 depicts a state in which a gain control of the data signal is performed when a power ratio is small.

FIG. 5 depicts a state in which a gain control of the common pilot signal is performed when the power ratio is small. When the power ratio is small, the gain control circuit 21a provided in the gain control system 20A for common pilot signals 2 changes the gain so that the power of the common pilot signal 2 in the input frame 1 becomes the reference value. FIG. 6 depicts a state in which a gain control of the data signal is performed when the power ratio is small. The gain control circuit 21b provided in the gain control system 20B for data signals 3 changes the gain so that the power of the data signal 3 in the same frame 1 becomes the reference value. As shown in FIGS. 5 and 6, even when the power ratio is small, the power ratio between the common pilot signal 2 and the data signal 3 is kept the same, while the gain is changed.

Attention is paid here to the signal input level with respect the ADCs 26a and 26b provided in these two gain control systems 20A and 20B. When seeing the signal input level with respect the ADCs 26a and 27a provided in the gain control system 20A, the input level of the common pilot signal 2 becomes the reference value, regardless of the power ratio. When seeing the signal input level with respect the ADCs 26b and 27b provided in the gain control system 20B, the input level of the data signal 3 becomes the reference value.

Accordingly, in the gain control system 20A for common pilot signals 2, the input level of the common pilot signal 2 can be gain-adjusted to an input level most suitable for the ADCs 26a and 27a. In the gain control system 20B for data signals 3, the input level of the data signal 3 can be gain-adjusted to the input most suitable for the ADCs 26b and 27b. Furthermore, not only the input level with respect to the ADCs 26 (26a, 26b) and 27 (27a, 27b), however, a requested back off value with respect to the analog devices (not shown, however, including the mixer and the amplifier) arranged in the previous stage of the ADCs 26 and 27 can be reduced, and the input level with respect to these analog devices can be adjusted to the optimum level as well. The gain adjustment is not limited to the one performed by bringing the input level with respect to the ADCs 26 and 27 and the analog devices to the reference value, and can be performed by adjusting the output level of the ADCs 26 and 27 and the analog devices so as to become the optimum level.

According to the gain control, since saturation of the ADCs 26 and 27, or S/N deterioration or distortion of the mixer and the amplifier as the analog devices do not occur, the reception quality can be improved without causing deterioration in the reception signal.

Even if the power ratio is large, and the power of the common pilot signal 2 is prominent with respect to the power of the data signal 3, the signal levels of the common pilot signal 2 and the data signal 3 can be adjusted to the reference value. Accordingly, as the dynamic range required for the ADCs 26 and 27, a general-purpose dynamic range (cheap and having low effective bit precision) adjusted to the reference value can be used, without requiring an expensive ADC having a wide dynamic range (with high effective bit precision).

The signal processor 30 selects and inputs a common pilot signal 2 from the gain control system 20A in a certain frame 1, and an individual data signal 3 from the gain control system 20B for data signals 3. Accordingly, various types of signal processing in the signal processor 30 can be performed stably at the optimum input level.

During a period when discrimination between the common pilot signal 2 and the data signal 3 in the frame 1 is unknown (asynchronous period), such as when the gain control is performed with respect to the received first frame 1, the reception power calculator 32 can perform gain control, assuming that the gain control signal g1 for the common pilot signal 2 and the gain control signal g2 for the data signal 3 have the same gain value. Thereafter, the reception power calculator 32 calculates the gain control signal g1 for the common pilot signal 2 and the gain control signal g2 for the data signal 3 as respectively suitable values, at the stage when the synchronization of the frame 1 can be established, and outputs the values to the gain control circuits 21a and 21b.

According to the first embodiment, when a frame is received, in which the common pilot signals and data signals of one or a plurality of users are arranged in a time-sharing manner in a unit of time slot, these common pilot signals and data signals are branched, to perform the gain control in an independent gain control system. Accordingly, even if there is a difference in the power of the common pilot signal and the data signal in each time slot, the common pilot signal and the data signal can be received, with a wide dynamic range being ensured, thereby preventing signal deterioration and improving the reception quality.

In the first embodiment, gain control is performed concurrently, designating one of the branched systems as the gain control system 20A for common pilot signals 2, and the other as the gain control system 20B for data signals 3. This configuration is for independently performing the gain control by branching the signals into two, assuming that the power of the common pilot signal 2 is steady, however, the power of the individual data signal 3 varies. Such a configuration in which the common pilot signal 2 and the data signal 3 are independently gain-controlled is for gain-controlling independently a large power slot and a power-saving slot by different gain control systems.

The divided two systems can be branched into large power and small power. Accordingly, gain control with respect to time slots having large power and gain control with respect to time slots having small power can be carried out concurrently. When having such a configuration, the reception power calculator 32 divides the time slots of large power and small power into two by using a threshold or the like, to carry out gain control with respect to the respective divided systems independently. The synchronization processor 31 selects and fetches the divided and appropriately gain-controlled output in a unit of slot. When measuring the reception level of the reference pilot signal 2 transmitted from the respective base stations, the signal processor 30 can measure the reception level accurately by using the digital value output from the ADC 26 and the control signal g1 of the control signals g1 and g2 for the AGC.

Figure 7:
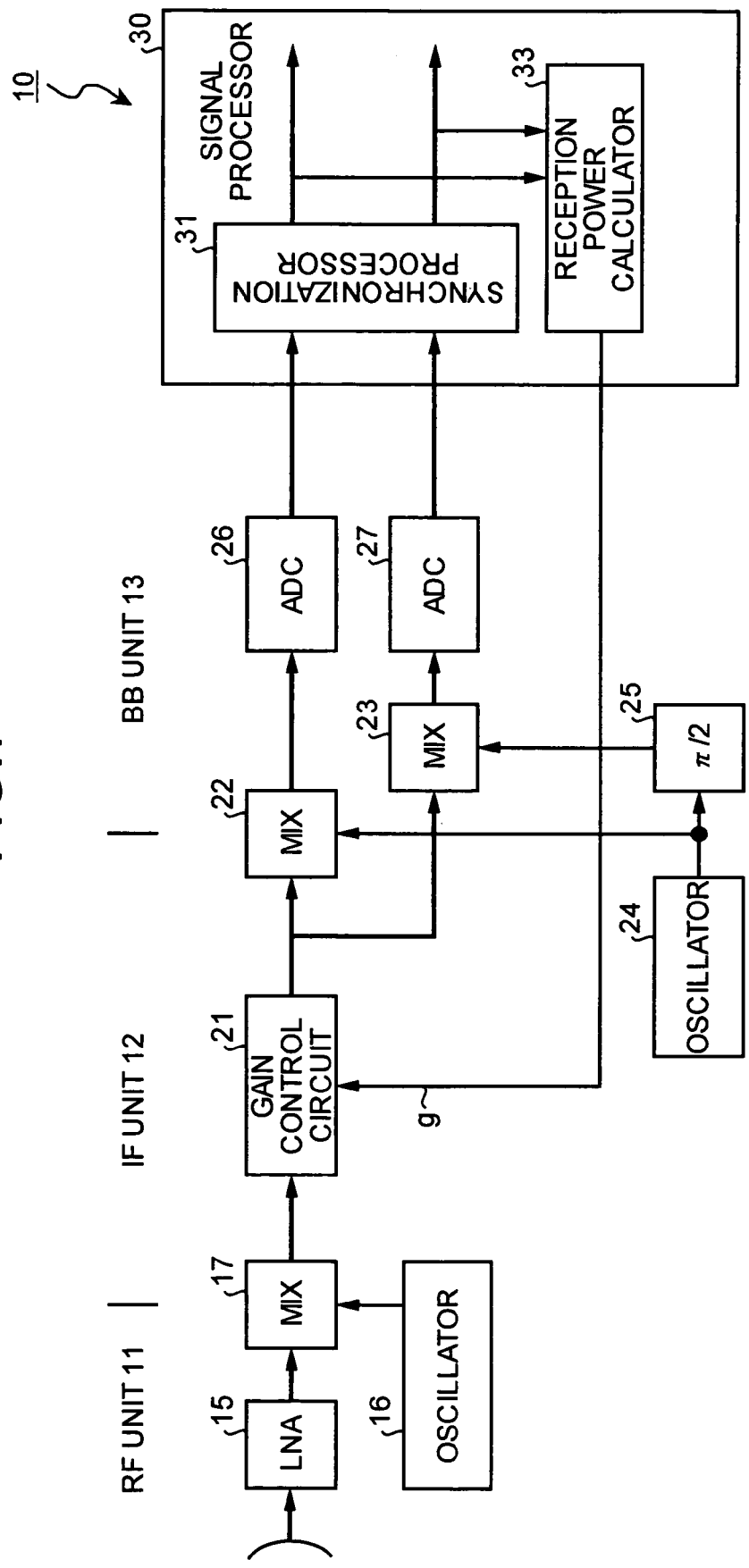
FIG. 7 is a block diagram of a radio receiver according to a second embodiment of the present invention.

FIG. 7 is a block diagram of a radio receiver according to a second embodiment of the present invention. Like reference symbols as in the configuration of the first embodiment (see FIG. 2) designates like parts. The second embodiment has a configuration in which gain control is performed in a unit of time slot by one system in a time-sharing manner, different from the first embodiment in which gain control is performed in two systems.

Figure 8:
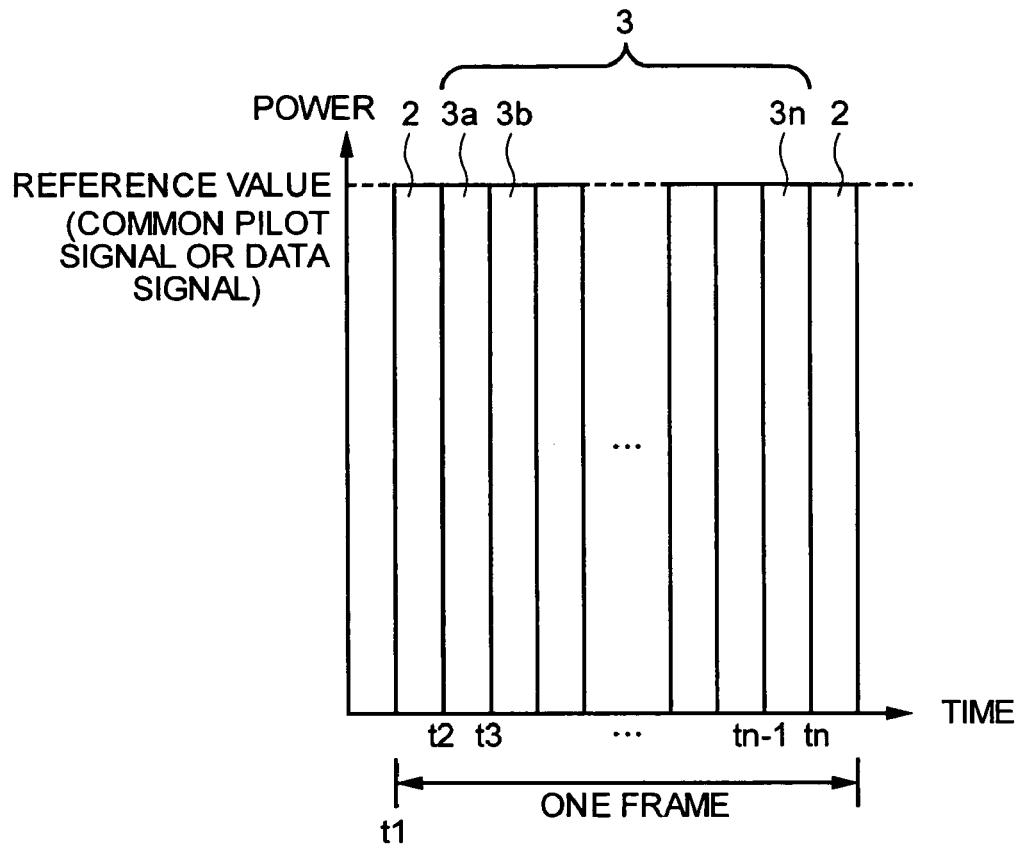
FIG. 8 depicts a state in which a gain control according to the second embodiment based on a divided time slot is performed.

The common pilot signal 2 and the individual data signal 3 are respectively input to the gain control circuit 21, and the gain control circuit 21 changes the gain for each time slot. FIG. 8 depicts a state in which a gain control status according to the second embodiment based on a divided time slot is performed. At time t1 when the common pilot signal 2 arranged at a start position of the frame 1 is input, the gain control circuit 21 changes the gain so that the power of the common pilot signal 2 becomes the reference value. When the power of the common pilot signal 2 is smaller than the reference value, the gain increased so that the power of the common pilot signal 2 becomes the reference value, and when the power of the common pilot signal 2 is larger than the reference value, the gain decreased so that the power of the common pilot signal 2 becomes the reference value. The different feature from the first embodiment is that, since the change of the gain is performed in a unit of time slot, the power of the data signal 3 in the same frame 1 is not changed at the time of changing the gain with respect to the common pilot signal 2.

A reception power calculator 33 calculates a gain control amount with respect to the common pilot signal 2 by averaging the transition of power of the common pilot signal 2 in a plurality of frames in the past. The gain control circuit 21 changes the gain according to the input of a gain control signal g based on the calculation result.

The reception power calculator 33 calculates a gain control amount with respect to the data signal 3 by averaging the transition of power of the data signal 3 in a plurality of frames in the past. The gain control circuit 21 changes the gain according to the input of the gain control signal g based on the calculation result. Accordingly, at time t2 when the data signal 3 is input, the gain control circuit 21 changes the gain so that the power of the data signal 3 becomes the reference value. Since the common pilot signal 2 and the data signal 3 are input to the same ADCs 26 and 27, the reference value of the common pilot signal 2 and that of the data signal 3 are the same.

During a period when a plurality of data signals 3 (3a to 3n) is being input (t2 to tn), the gain control circuit 21 can control the gain of all data signals 3 with the same gain control amount, regarding that there is no change in the power of the data signals 3. Accordingly, it is not necessary that the reception power calculator 33 outputs the gain control signal g in a unit of time slot, thereby avoiding high-speed processing in a unit of time slot. Alternatively, the gain can be controlled in a unit of each time slot of the data signals 3 (3a to 3n). This method can be applied if there is an environment in which the reception power calculator 33 can perform high-speed processing. In this case, even if the power of the data signals 3 (3a to 3n) changes for each time slot (t2, t3, tn−1), this change can be handled.

The common pilot signal 2 arranged at the end position of the frame 1 is gain-controlled based on the gain control signal g, which indicates the same gain control amount as that of the common pilot signal 2 arranged at the start position of the frame 1.

Accordingly, as shown in FIG. 8, the gain can be changed so that both of the common pilot signals 2 and the data signals 3 have the same reference value. Since the gain can be controlled for each time slot, gain control is performed so that the power of the common pilot signals 2 and the data signals 3 are adjusted to the reference value at all times, as shown in FIG. 8, regardless of the power ratio between the common pilot signal 2 and the data signal 3.

During a period when discrimination between the common pilot signal 2 and the data signal 3 in the frame 1 is unknown (asynchronous period), such as when the gain control is performed with respect to the received first frame 1, the reception power calculator 33 can perform gain control, assuming that the gain control signal g for the common pilot signal 2 and the data signal 3 have the same gain value. Thereafter, the reception power calculator 33 calculates the gain value with respect to the common pilot signal 2 and the gain value with respect to the data signal 3 as respectively suitable values, at the stage when the synchronization of the frame 1 can be established, and outputs the values to the gain control circuit 21.

According to the second embodiment, when a frame is received, in which the common pilot signal and data signals of one or a plurality of users are arranged in a time-sharing manner in a unit of time slot, appropriate gain control is performed respectively for each time slot having received these common pilot signals and data signals. Accordingly, even if there is a difference in the power of the common pilot signal and the data signal in each time slot, the common pilot signal and the data signal can be received, with a wide dynamic range being ensured, thereby preventing signal deterioration and improving the reception quality.

The received frame format in the first and the second embodiments is not limited to the frame configuration described above (see FIG. 1), and can be applied to other frame formats.

Figure 9:
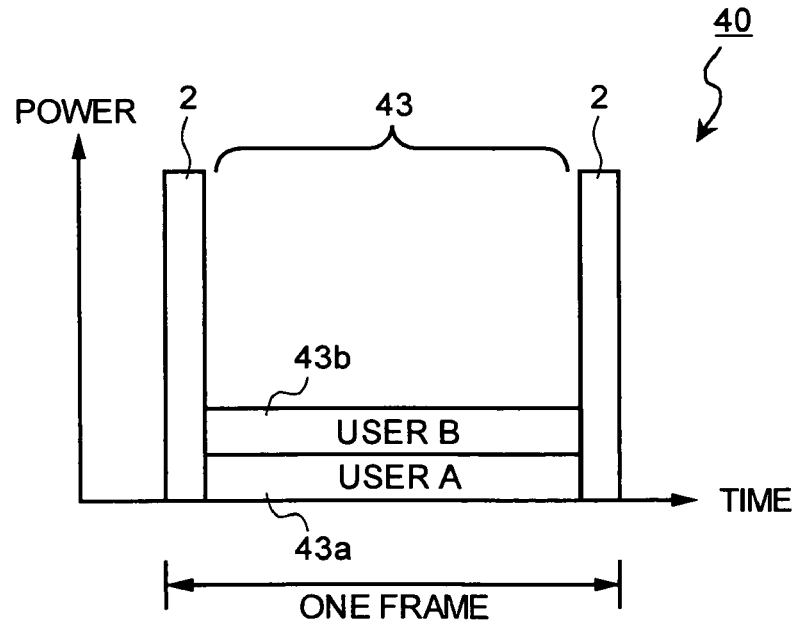
FIG. 9 depicts another frame format of a radio signal to be received by the radio receiver according to the embodiment of the present invention.

FIG. 9 depicts another frame format of the radio signal to be received by the radio receiver according to embodiments of the present invention. Time is plotted on the horizontal axis and power is plotted on the vertical axis. There are common pilot signals 2 and a plurality of data signals 43 (43a to 43n) in one frame. These common pilot signals 2 and the data signals 43 are allocated to different time slots in a time-sharing manner. The common pilot signals 2 are arranged at the start position and the end position of the frame 1, and the data signals 43 (43a to 43n) allocated to one or a plurality of users are arranged between the common pilot signals 2.

Figure 10:
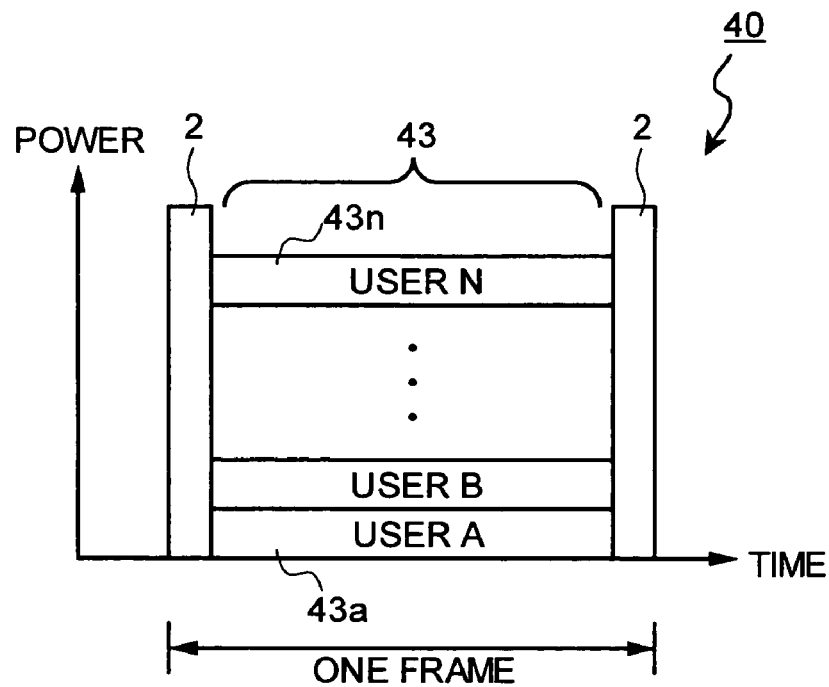
FIG. 10 depicts the same frame format as that shown in FIG. 9, and depicts a power status when the number of users is N.

The data signals 43 having a certain power in a frame format 40 shown in FIG. 9 are allocated to each user over a plurality of time slots between the common pilot signals 2. That is, the power of the data signals 3 increases corresponding to the number of users. For example, when the number of users is 2, the sum of the data signals 43a and 43b of these users A and B becomes the power of the data signal 43. FIG. 10 depicts the same frame format as that shown in FIG. 9, and depicts a power status when the number of users is N. As shown in FIG. 10, when the number of users increases, the sum of the data signals 43a to 43n of the users A to N becomes the power of the data signal 43.

FIG. 9 indicates a condition in which the power of the data signal 3 is small with respect to the power of the common pilot signal 2 (the power ratio is large), and FIG. 10 indicates a condition in which the power of the data signal 3 is close to the power of the common pilot signal 2 (the power ratio is small). According to the frame configuration shown in FIGS. 9 and 10, the power of the data signals 3 increases as the number of users increase, at the time of low-speed communication. Thus, even when the format of the data signal 43 is different, or when the frame format is such that the common pilot signals 2 and the data signals 43 are included in the same frame format 40 and the power is different in each time slot, the gain control explained in the first or the second embodiment can be executed likewise.

Figure 11:
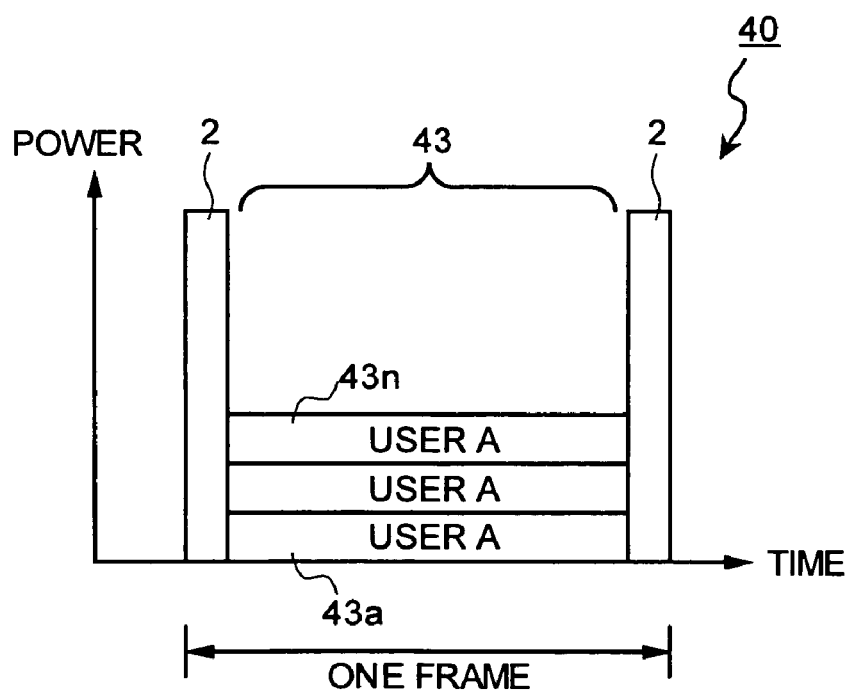
FIG. 11 depicts the same frame format as that shown in FIG. 9, and depicts a power status at the time of high-speed communication.

FIG. 11 depicts the same frame format as that shown in FIG. 9, and depicts a power status at the time of high-speed communication. The frame configuration shown in FIG. 11 is at the time of high-speed communication. At the time of high-speed communication, even when the number of users is only one (user A), a data signal 43a having a certain power for the user A is arranged over a plurality of time slots between the common pilot signals 2. In this configuration, further, the user A performs multiplexing by using a plurality of data signals 43a to 43n during the same period. Thus, by occupying the data signals 43 by a specific user, high-speed communication becomes possible. Accordingly, even when the frame format is such that the common pilot signals 2 and the data signals 43 are included in the same frame format 40 and the power is different in each time slot due to the degree of high speed, the gain control explained in the first or the second embodiment can be executed likewise.

Since the second embodiment has a configuration in which the gain control is performed in a unit of time slot, gain control with respect to the data signals 3 (or the data signals 43) is performed immediately after the common pilot signal 2 is received in a certain time slot and gain control with respect to the common pilot signal 2 is performed, in the next time slot. In this case, it can be considered that predetermined time is required for gain control of the data signals 3 or 43, as the power ratio between the common pilot signal 2 and the data signal 3 or 43 increases due to a time constant of the gain control (AGC voltage transient characteristic) included in the gain control circuit 21. The same thing applies when the gain control with respect to the common pilot signal 2 is performed immediately after the gain control with respect to the data signal 3 (or the data signal 43) is performed, in the next time slot.

Figure 12:
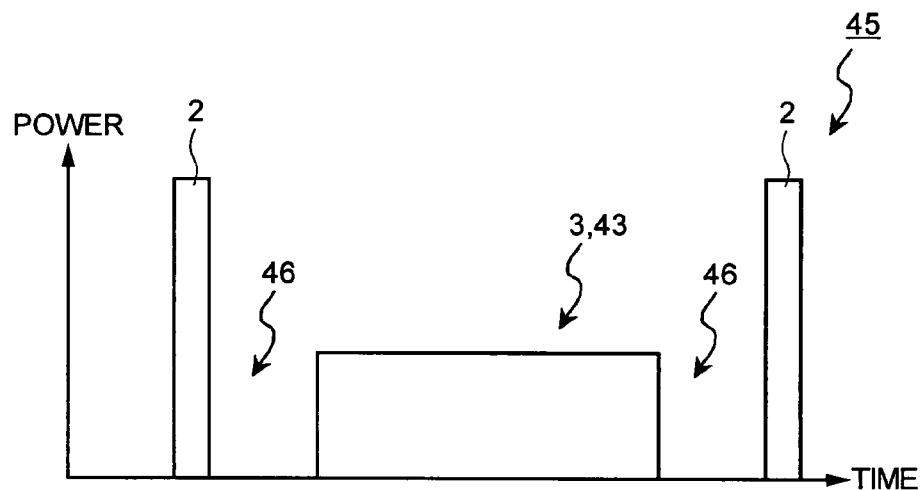
FIG. 12 depicts a frame format in which a delay slot for an AGC operation time is provided.

FIG. 12 depicts a frame format in which a delay slot for the AGC operation time is provided. In the configuration in which gain control is performed for each time slot as in the second embodiment, a frame format 45 in which a delay slot 46 is arranged between the common pilot signal 2 and the data signals 3 or 43 is used. The period of the delay slot 46 is assumed to be a period (number of slots) corresponding to the AGC voltage transient characteristic. The power value during this period is set to zero or a value close to zero.

Thus, by arranging the delay slot 46, the gain control circuit 21 can suspend the operation of the gain control by the time of the delay slot 46, after having performed the gain control during the period of time slot for the common pilot signal 2. Accordingly, the influence of transient state after the gain control performed with respect to the common pilot signal 2 can be eliminated at the time of subsequent gain control with respect to the data signals 3 or 43, and gain control with respect to the data signals 3 or 43 can be performed appropriately in a short period of time.

In the respective embodiments above, the power of the common pilot signal 2 and the power of the data signal 3 or 43 are detected to calculate the gain value by the reception power calculator 32 or 33, and the gain control signal g (g1, g2) is output to the gain control circuit 21 (21a, 21b), to control the gain. The radio receiver according to the present invention can be applied to mobile equipment in a mobile phone system. The mobile equipment receives a signal in the frame format 1, 40, or 45 transmitted from a base station. Furthermore, the mobile equipment can receive a control signal of an information channel or a control channel transmitted from the base station, including the information of the power ratio. When the information of the power ratio can be received, the reception power calculator 32 or 33 in the radio receiver 10, which is the mobile equipment, can calculate the average power of the common pilot signals 2 and the average power of the data signals 3, 43 in the frame 1 based on the input power ratio information, without establishing synchronization of the frame 1.

Figure 13:
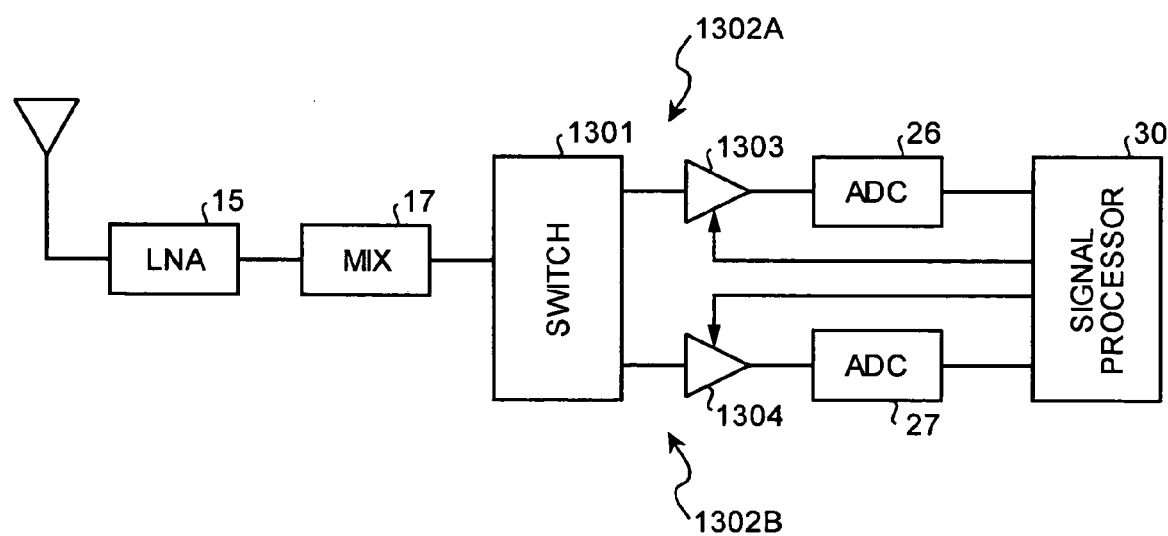
FIG. 13 is a block diagram of a radio receiver according to a third embodiment of the present invention.

FIG. 13 is a block diagram of a radio receiver according to a third embodiment of the present invention. Like reference symbols as in the configuration of the first and the second embodiments refer to like parts. In the third embodiment, a switch 1301 is provided in the RF band or the IF band, and a first signal (for example, the common pilot signal 2) time-multiplexed on the reception signal is selectively output to a first system 1302A, and a second signal (for example, user data such as the data signal 3) is selectively output to a second system 1302B, by switching the switch 1301.

As for the timing to switch the switch 1301, the signal processor 30 obtains the reception timing of the respective signals and switches the switch 1301 based on the timing. With regard to the first system 1302A, the signal processor 30 calculates the power by using a digital value corresponding to the time when the first signal, of the signals guided by the switch 1301, is input, to generate a signal for controlling the AGC, and performs gain control with respect to an amplifier 1303 provided in the first system 1302A. With regard to the second system 1302B, the signal processor 30 calculates the power by using a digital value corresponding to the time when the second signal, of the signals guided by the switch 1301, is input, to generate a signal for controlling the AGC, and performs gain control with respect to an amplifier 1304 provided in the second system 1302B.

According to this configuration, it can be prevented that a signal at an unexpected reception level is input respectively to the ADCs 26 and 27 and elements (not shown) provided in the first system 1302A and the second system 1302B, thereby protecting the ADCs 26 and 27 and these elements. The switch 1301 can be provided in the RF band. In this case, by providing the switch 1301 in the previous stage of the mixer 17, and providing mixers 17 and amplifiers 1303, 1304, respectively, in the first system 1302A and the second system 1302B, the AGC can be performed in the same manner.

All embodiments described above adopts the transmission method having a time length, for example, less than 1 microsecond as one frame of the radio signal, and can be used particularly preferably when the first signal (the common pilot signal 2) and the second signal (user data such as the data signal 3) are transmitted from the same transmission body to the same reception body. As for the RF unit, the IF unit, and the BB unit provided in the radio receiver, a common unit is generally used with respect to various signals. In such a configuration, common AGC is performed by using the result of power measurement without discriminating between the first signal and the second signal. If the time length of one frame becomes equal to or less than 1 microsecond, it becomes difficult to perform the AGC corresponding to the various signals. According to the respective embodiments of the present invention, even when the change frequency or change rate of the transmission power of one of the first signal and the second signal with respect to the other is large, and the first and the second signals are time-multiplexed and transmitted from a common sender to a common destination at a common frequency, the first and the second signals are discriminated from each other and power thereof is measured, thereby enabling AGC of the first and the second signals.

When processing (or outputting) the first and the second signals again in the multiplexed state, the signal processor 30 can multiplex and use respective digital values of the first signal portion and the second signal portion of the output from the ADCs 26 and 27 in the first and the second systems in the original order. Specifically, the portions of the common pilot signal 2 in FIG. 3 and the data signal 3 in FIG. 4 are multiplexed.

The present invention is not limited to the above embodiments, and can be changed variously. For example, the number of slots used for the common pilot signal and the individual data signal can be selected variously according to the frame format.

According to the embodiments described above, even when a power difference occurs between time slots within one frame, a stable gain control can be performed. Accordingly, the ADC and the analog devices, to which the gain-controlled signal is input, can be operated stably. Accordingly, signal saturation and S/N deterioration can be prevented, thereby enabling appropriate signal processing, and improvement in a reception quality.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A radio receiver comprising:
a receiving unit configured to receive a radio signal in which a first signal and a second signal are time-multiplexed in a frame;
a gain-control unit configured to perform a gain control on the radio signal with a different gain for each of the first signal and the second signal; and
a power detecting unit configured to detect a power of the received radio signal in each time slot,
wherein the gain-control unit performs the gain control when a change in power detected by the power detecting unit between time slots is large, while the gain-control unit does not perform the gain control when the change in power detected by the power detecting unit between the time slots is not large.

2. The radio receiver according to claim 1, further comprising:
a branching unit configured to branch received radio signal into two branch radio signals, each branch radio signal including the first signal and the second signal;
a power detecting unit configured to detect a power of the first signal and a power of the second signal in the received radio signal;
a power calculating unit configured to calculate a first gain for the first signal and a second gain for the second signal based on detected powers; and
a signal processing unit configured to process the received radio signal, wherein
the gain-control unit includes
a first gain-control unit configured to perform a gain control of the first signal in one of the branch radio signals based on the first gain;
a second gain-control unit configured to perform a gain control of the second signal in another of the branch radio signals based on the second gain concurrently with the gain control by the first-gain control unit, and
the signal processing unit is configured to choose the first signal on which the gain control has been performed by the first gain-control unit and the second signal on which the gain control has been performed by the second gain-control unit, to process the received radio signal.

3. The radio receiver according to claim 2, wherein the first signal has a higher power than a threshold, and the second signal has a lower power than the threshold.

4. The radio receiver according to claim 2, wherein the power calculating unit is arranged in a stage subsequent to the gain control unit, and calculates the first gain and the second gain based on an input/output level for an analog-to-digital converter that performs an analog-to-digital conversion on data in the radio signal on which the gain control has been performed.

5. The radio receiver according to claim 2, wherein the power calculating unit is arranged in a stage subsequent to the gain control unit, and calculates the first gain and the second gain based on an input/output level for an analog device that performs signal processing on data in the radio signal on which the gain control has been performed.

6. The radio receiver according to claim 1, further comprising:
a power calculating unit configured to calculate at least one gain value based on detected power, wherein
the gain-control unit is configured to perform the gain control on the received radio signal based on the gain value.

7. The radio receiver according to claim 6, wherein
the power detecting unit includes a signal detecting unit configured to detect the first signal and the second signal within a frame, based on a change in power between time slots, and the signal detecting unit determines that a signal is changed between the first signal and the second signal only when the change is large.

8. The radio receiver according to claim 6, further comprising
a synchronization determining unit configured to determine whether synchronization of a plurality of frames in the received radio signal is established, wherein
the power calculating unit is configured to obtain an average power by averaging powers detected in the frames for each corresponding time slot when the synchronization determining unit determines that the synchronization is established, and
the power calculating unit calculates the gain value based on the average power.

9. The radio receiver according to claim 6, further comprising
a synchronization determining unit configured to determine whether synchronization of a plurality of frames in the radio signal is established, wherein
the gain control unit is configured to perform the gain control based on a gain value that is set in advance for each time slot in the radio signal when the synchronization determining unit determines that the synchronization is not established.

10. A gain control method performed by a processor comprising:
receiving by an antenna a radio signal in which a first signal and a second signal are time-multiplexed in a frame;
performing by the processor a gain control on the radio signal with a different gain for each of the first signal and the second signal;
detecting by the processor a power of the received radio signal in each time slot; and
performing by the processor the gain-control when a change in detected power between time slots is large, and not performing the gain-control when the change in detected power between time slots is not large.

11. The gain control method according to claim 10, further comprising:
branching received radio signal into two branch radio signals, each branch radio signal including the first signal and the second signal;
detecting a power of the first signal and a power of the second signal in the received radio signal;
calculating a first gain for the first signal and a second gain for the second signal based on detected powers; and
processing the received radio signal, wherein
the performing includes
performing a gain control of the first signal in one of the branch radio signals based on the first gain;
performing a gain control of the second signal in another of the branch radio signals based on the second gain concurrently with the gain control of the first signal.

12. The gain control method according to claim 11, wherein the first signal has a higher power than a threshold, and the second signal has a lower power than the threshold.

13. The gain control method according to claim 11, wherein the calculating includes calculating the first gain and the second gain based on an input/output level for an analog-to-digital converter that performs an analog-to-digital conversion on data in the radio signal on which the gain control has been performed.

14. The gain control method according to claim 11, wherein the calculating includes calculating the first gain and the second gain based on an input/output level for an analog device that performs signal processing on data in the radio signal on which the gain control has been performed.

15. The gain control method according to claim 10, further comprising:
calculating at least one gain value based on detected power, wherein
the performing includes performing the gain control based on the gain value.

16. The gain control method according to claim 15, further comprising
detecting a change of signals between the first signal and the second signal within a frame, based on a change in power between time slots, wherein
when it is determined that a signal is changed between the first signal and the second signal only when the change is large.

17. The gain control method according to claim 15, further comprising:
determining whether synchronization of a plurality of frames in the radio signal is established; and
obtaining an average power by averaging powers detected in the frames for each corresponding time slot when it is determined that the synchronization is established at the determining, and
the calculating includes calculating the gain value based on the average power.

18. The gain control method according to claim 15, further comprising
determining whether synchronization of a plurality of frames in the radio signal is established, wherein
the performing includes performing the gain control based on a gain value that is set in advance for each time slot in the radio signal when it is determined that the synchronization is not established at the determining.

* * * * *

UNITED STATES PATENT AND TRADEMARK OFFICE
CERTIFICATE OF CORRECTION

PATENT NO. : 7,593,705 B2  
APPLICATION NO. : 11/287787  
DATED : September 22, 2009  
INVENTOR(S) : Sato et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 938 days.

Signed and Sealed this

Twenty-eighth Day of September, 2010

David J. Kappos  
*Director of the United States Patent and Trademark Office*